SILICON CONTROLLED RECTIFIER CIRCUIT INCLUDING
A VARIABLE FREQUENCY OSCILLATOR
Filed Sept. 1, 1959

FIG. 2. START STOP CONTROL CIRCUIT

FIG. 3. OSCILLATOR WITH PULSE WIDTH CONTROL

INVENTOR:
FRANK W. GUTZWILLER,

BY James J. Williams
HIS ATTORNEY.

United States Patent Office 3,040,270

Patented June 19, 1962

3,040,270

SILICON CONTROLLED RECTIFIER CIRCUIT INCLUDING A VARIABLE FREQUENCY OSCILLATOR

Frank W. Gutzwiller, Auburn, N.Y., assignor to General Electric Company, a corporation of New York Filed Sept. 1, 1959, Ser. No. 837,386
4 Claims. (Cl. 331—113)

This invention relates to an electrical control circuit, and particularly to an electrical control circuit utilizing a multi-junction, semiconductor, unidirectional conducting device together with means for controlling the conduction of the device in order that current passing through the device to a load may be controlled.

Semiconductor devices consisting of alternate zones of P and N types of semiconducting materials located contiguous to each other so as to present an odd number of P-N junctions have been utilized to provide a controllable unidirectional conducting device. Such semiconductor devices will conduct in response to a turn-on or gate signal of a relatively low value applied to the gate element of such a device. Further, such devices, after being biased into a non-conducting state by the application of a turn-off or blocking signal, can recover quickly and conduct again in response to a further turn-on or gate signal.

An object of this invention is to provide an improved control circuit for a multi-junction, semiconductor, unidirectional conducting device, this control circuit being capable of providing the relatively low value turn-on signal for the gate element of the device so as to initiate conduction of the device, and at the desired time providing a signal effective to interrupt conduction of the device and thereby permit the gate element of the device to resume its ability to control the device.

Another object of this invention is to provide an improved control circuit for use with a multi-junction, semiconductor, unidirectional conducting device that has an odd number of P-N junctions and that passes current to a load, the control circuit supplying controllable turn-on signals and turn-off signals.

Another object of this invention is to provide a control circuit for semiconductor, unidirectional conducting devices having an odd number of P-N junctions, where the control circuit provides a turn-on signal in accordance with the requirements of a load being supplied and a turn-off signal either in accordance with the requirements of the load or at the option of an operator.

Another object of this invention is to provide a control circuit for semiconductor, unidirectional conducting devices having an odd number of P-N junctions, the control circuit being effective to control or limit the passage of current to a load by such devices in accordance with the current carrying ability of the load.

In accordance with one embodiment of this invention, there is provided a control circuit comprising a controllable, semiconductor, unidirectional conducting device coupled between a load and a source. The control circuit further comprises means to control the conduction of the device, and may also comprise means responsive to a load characteristic or responsive to the effect of an additional controlling means to interrupt energization of the load by stopping the conduction of the device.

The subject matter which I regard as my invention is particularly pointed out and distinctly claimed in the concluding portion of this specification. My invention, however, both as to its structure and mode of operation together with further objects and advantages thereof, may best be understood by reference to the following description taken in connection with the accompanying drawing in which:

FIGURES 1(*a*) and 1(*b*) illustrate a controllable multi-junction, semiconductor, unidirectional conducting device which may be used to achieve the objects of the invention;

FIGURE 2 is a schematic illustration of one embodiment of the invention; and

FIGURE 3 is a schematic illustration of another embodiment of the invention.

Figure 1A:
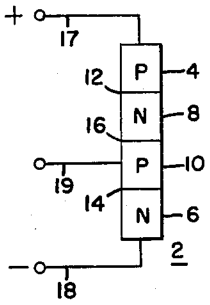
Figure 1B:
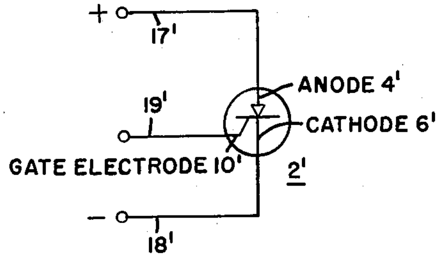
Figure 1B:
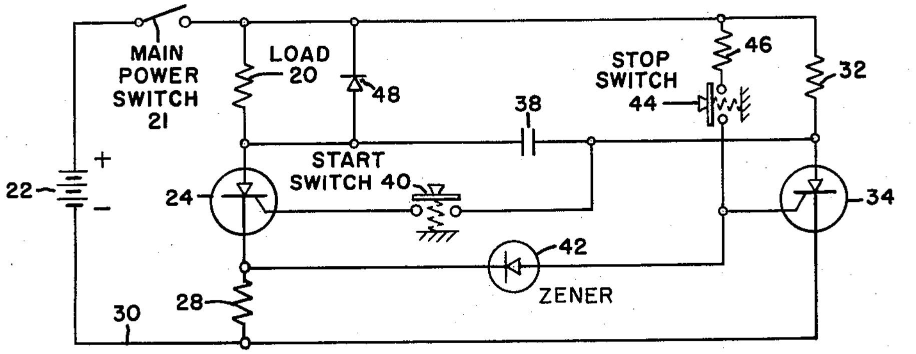
Figure 1B:
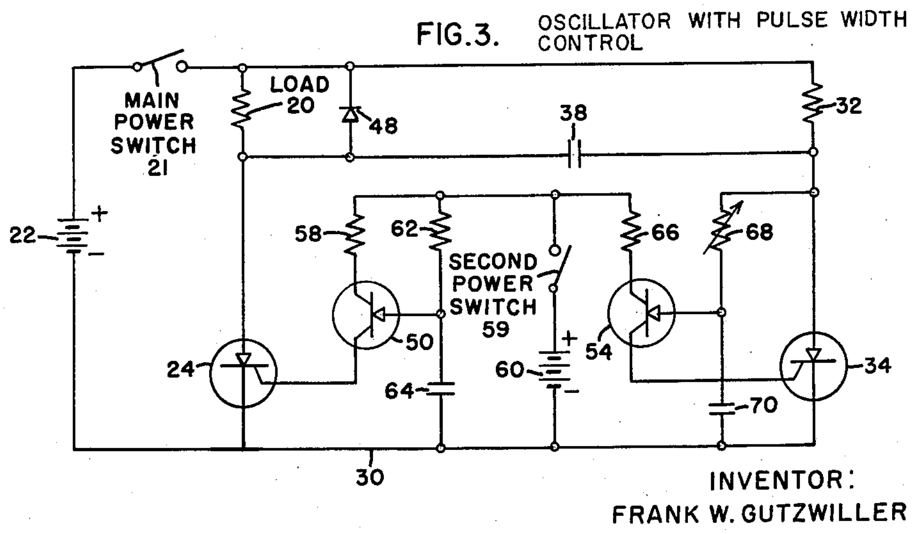

FIGURE 1(*a*) of the drawing structurally illustrates a semiconductor device 2 which may be used in the invention. As shown, the device is constituted by four contiguous zones of semiconducting material. A first end or outside zone 4 is constituted by P-type semiconducting material, while the second end or outside zone 6 is constituted by N-type semiconducting material. The device also includes two inner or intermediate zones 8, 10. The first inner zone 8 is constituted by N-type material and the second inner zone 10 is constituted by P-type material. The four zones form a pair of outer junctions 12, 14 and an inner or center junction 16. A first conductor 17 is connected to the first end zone 4 so as to have an ohmic connection therewith while a second conductor 18 has an ohmic connection with the second end zone 6. A third conductor 19 is connected to the second inner zone 10 constituted by P-type material. A device of this character is known and is frequently referred to as a controlled rectifier. In order that my invention may be understood, it is proposed to present a brief description of the device's operation. The first end zone 4 of the P-type material together with the conductor 17 attached thereto may be considered an anode, while the second end zone 6 of N-type material together with its conductor 18, may be considered a cathode. If a source of unidirectional potential is applied between the conductors 17, 18 so that the first end zone 4 of P-type material is positive with respect to the second end zone 6 of N-type material, then the outer junctions 12, 14 are forwardly biased and the inner junction 16 is reversely biased. However, even with the outer junctions 12, 14 forwardly biased, the device 2 will not normally conduct because the inner junction 16 is reversely biased. However, if the inner junction 16 is forwardly biased, conduction through the device 2 will occur. The inner junction 16 may be forwardly biased either by the first end zone 4 being made very positive with respect to the second end zone 6, or by the application of a potential to the third conductor 19 to cause the flow of gate current from the third conductor 19 to the second end zone 6. However the conduction is brought about, it provides a current through the device 2 which is limited only by the amount of impedance in series with the device 2. If the conduction is brought about by the flow of gate current from the third conductor 19 to the second end zone 6, the third conductor 19 may be considered a gate or control electrode. Thus, a controllable semiconductor device can be provided. The device 2 shown structurally in FIGURE 1(*a*) is shown schematically in FIGURE 1(*b*) as having an anode 4', a cathode 6', and a gate or control electrode 10', these electrodes being attached to the first end zone 4, the second end zone 6, and the second inner zone 10 respectively. The conductors 17', 18', 19' of FIGURE 1(*b*) are comparable to the first, second, and third conductors 17, 18, 19 respectively of FIGURE 1(*a*). Thus, a controllable semiconductor device is provided. However, once the device does begin conducting current in the forward direction, removal of the gate electrode potential, which was applied to the third conductor 19 and which caused the gate current to flow, will not stop or terminate this conduction. In order that this conduction may be stopped, the potential between the end zones 4, 6 must be changed or reduced or reversed for a short period of time so that conduction falls below the minimum or holding current. Once this situation is brought about, the device 2 will cease to conduct entirely even though the first end zone 4 is subsequently made positive (that is normally positive) with respect to the second end zone 6. Conduction is brought about again only by one of the two methods mentioned.

From the above description, it will be seen that the device of FIGURES 1(*a*) and 1(*b*) provides a controlled rectifying device. As previously indicated, one of the objects of the invention is to provide a control circuit for use with such devices, the control circuit supplying controllable turn-on and turn-off signals for the device. FIGURE 2 shows one such control circuit in accordance with the invention. The circuit of FIGURE 2 is intended to supply current to a load 20, and limit the current so supplied to some predetermined value. The load 20 has one end coupled through a main power switch 21 to the positive terminal of a suitable source of unidirectional potential 22 and has the other end coupled to the anode of a first controlled rectifier 24. The cathode of the first controlled rectifier 24 is coupled through a voltage developing resistor 28 to a reference potential bus 30. The reference potential bus 30 is coupled back to the negative terminal of the source of unidirectional potential 22. A voltage dropping resistor 32 has one end also coupled through the power switch 21 to the positive terminal of the source of unidirectional potential 22, and has its other end coupled to the anode of a second controlled rectifier 34. The cathode of the second controlled rectifier 34 is coupled to the reference potential bus 30. The anodes of the first and second controlled rectifiers 24, 34, are coupled together by a suitable charging capacitor 38. The gate electrode of the first controlled rectifier 24 is coupled through a normally open start switch 40 to the anode of the second controlled rectifier 34. The gate electrode of the second control rectifier 34 is coupled to the anode of a Zener diode 42, the cathode of the Zener diode 42 being coupled to the cathode of the first controlled rectifier 24. The gate electrode of the second controlled rectifier 34 is also coupled to the positive terminal of the source of unidirectional potential 22 through the series circuit including a normally open stop switch 44, a resistor 46, and the power switch 21. If the load 20 is at all inductive in nature, a free-wheeling diode 48 may be connected in parallel with the load 20 to discharge the energy stored in the inductive load on turn-off.

With the circuit of FIGURE 2 arranged in the manner just described, and with the power switch 21, the start switch 40, and the stop switch 44 open as also described, neither of the controlled rectifiers 24, 34 is conducting. Hence, no current flows through the load 20. However, when the power switch 21 is closed and the start switch 40 is depressed, it closes a circuit from the positive terminal of the source of unidirectonal potential 22 through the load 20 and the charging capacitor 38 to the gate electrode of the first controlled rectifier 24. The surge of current charging the charging capacitor 38 and flowing into the gate electrode of the first controlled rectifier 24 is of such value as to cause the first controlled rectifier 24 to conduct anode current, this anode current flowing through the load 20 in accordance with the demands of the load 20. However, no anode current is flowing through the second controlled rectifier 34. Hence, the charging capacitor 38 is charged so that its right-hand plate (as viewed in FIGURE 2) becomes positive with respect to its left-hand plate (as viewed in FIGURE 2). This results from the fact that the right-hand plate of the charging capacitor 38 is essentially at the positive potential of the source of potential 22 while the left-hand plate of the charging capacitor 38 is at some potential less than the positive potential because of the voltage drop across the load 20. If it is desired to cut off current flowing through the load 20, the stop switch 44 may be momentarily depressed. When the stop switch 44 is depressed, it closes a circuit from the positive terminal of the source of potential 22 through a resistor 46 to the gate electrode of the second controlled rectifier 34. Current flows into the gate electrode so that the second controlled rectifier 34 conducts anode current. When the second controlled rectifier 34 conducts anode current, it presents a very low voltage drop between its anode and cathode, and hence the right-hand plate of the charging capacitor 38 is, essentially, connected to the cathode of the first controlled rectifier 24. As will be seen in FIGURE 2, the left-hand plate of the charging capacitor 38 is already connected to the anode of the first controlled rectifier 24. Thus, the negative left-hand plate of the charging capacitor 38 appears at the anode of the first controlled rectifier 24 and the positive right-hand plate of the charging capacitor 38 appears at the cathode of the first controlled rectifier 24. Thus, the first controlled rectifier 24 has a reverse voltage applied between its anode and cathode to cause the first controlled rectifier 24 to cease conducting. The first controlled rectifier 24 will remain in its non-conducting state until the start switch 40 is again depressed or closed. Depending upon the magnitude of the voltage dropping resistor 32, the second controlled rectifier 34 may continue conducting only as long as the charging capacitor 38 retains its initial charge. Once the charge on the charging capacitor 38 reverses sufficiently, the combined currents supplied by the charging capacitor 38 and the voltage dropping resistor 32 fall below the value necessary to maintain conduction (called holding current) through the second controlled rectifier 34, and the second controlled rectifier 34 will then cease to conduct. The voltage dropping resistor 32 may be selected to have such a value that a small standby or quiescent current may continue to flow through the anode of the second controlled rectifier 34.

The circuit of FIGURE 2 as thus far described (i.e., not considering the Zener diode 42) is a simple start-stop circuit which utilizes a start switch 40 and a stop switch 44. It will be appreciated by persons skilled in the art that these switches 40, 44 may be manual as indicated or may be electrically or electronically controlled in response to some desired circuit function. The control circuit of FIGURE 2 may also be used to limit the value of current which flows through the load 20. If the current through the load 20 and the first controlled rectifier 24 increases, it will be seen that the voltage across voltage developing resistor 28 also increases. As this voltage increases, the cathodes of the first controlled rectifier 24 and the Zener diode 42 become increasingly positive with respect to the reference potential bus 30. When this voltage becomes more positive than some predetermined level, this level depending, among other things, upon the reverse breakdown characteristics of the Zener diode 42, the Zener diode 42 will begin conducting current in the reverse direction, namely from its cathode to its anode. When the Zener diode 42 so conducts, the positive potential at the cathodes of the first controlled rectifier 24 and the Zener diode 42 causes gate current to flow so that the second controlled rectifier 34 conducts anode current. As already pointed out when the second controlled rectifier 34 conducts anode current, it will cause the first controlled rectifier 24 to cease conduction. Hence, it is seen that if the current flow through the load 20 exceeds some predetermined level, the circuit functions to cut off the main load current flow. Thus, the control circuit acts, in effect, like a circuit breaker, the circuit breaker action being very rapid. It is possible to interrupt short-circuit currents before they reach destructive values. The maximum amount of current which it is desired to have flow through the load 20 may be set by varying the value of the voltage developing resistor 28 within certain limits. Thus, if the voltage developing resistor 28 has its magnitude of resistance increased, less current flow through the load 20 is required in order to break down the reverse voltage of the Zener diode 42 and cut off current flow. Likewise, if the voltage developing resistor 28 has its magnitude of resistance decreased, more current flow through the load 20 is required to develop the necessary reverse voltage which breaks down the Zener diode 42.

The embodiment described in connection with FIGURE 2 refers to a control circuit having a source of unidirectional potential. It will be appreciated by persons skilled in the art that two of the control circuits shown in FIGURE 2 may be connected back-to-back with a load circuit, so that a source of alternating current potential may be used to provide power for the load.

FIGURE 3 shows a control circuit in accordance with the invention that utilizes controlled rectifiers for the purpose of controlling current flowing through a load. In FIGURE 3, the same reference numerals are used where the elements of FIGURE 3 correspond to the elements of FIGURE 2. In FIGURE 3, it will be seen that the first and second controlled rectifiers 24, 34 have their anodes coupled by the charging capacitor 38 in the same manner as in FIGURE 2. However, there is provided additional circuitry between the gate electrodes of the controlled rectifiers 24, 34. This circuitry comprises a first unijunction transistor 50 and a second unijunction transistor 54. These unijunction transistors 50, 54 are known in the art, but will be briefly described. These unijunction transistors 50, 54 each comprise an emitter, a first base, and a second base. The characteristics of such unijunction transistors are that if the emitter becomes sufficiently positive with respect to one of the bases, a heavy flow of current takes place between the emitter and that one base. While other electron devices could be used in place of the unijunction transistors 50, 54, the unijunction transistors 50, 54 provide desirable operation in the circuit shown in FIGURE 3. The second base of the first unijunction transistor 50 is coupled through a base resistor 58 and a second power switch 59 to the positive terminal of a second source of unidirectional potential 60, and the first base of the first unijunction transistor 50 is coupled to the gate electrode of the first controlled rectifier 24. The negative terminal of the second source of unidirectional potential 60 is connected to the reference potential bus 30. The emitter of the first unijunction transistor 50 is coupled to the positive terminal of the second source of unidirectional potential 60 through an emitter resistor 62 and the second power switch 59. A first timing capacitor 64 is coupled between the emitter of the first unijunction transistor 50 and the reference potential bus 30. With reference to the second unijunction transistor 54, its second base is coupled through a base resistor 66 and the second power switch 59 to the positive terminal of the source of unidirectional potential 60, and its first base is coupled to the gate electrode of the second controlled rectifier 34. The emitter of the second unidirectional unijunction transistor 54 is coupled through an adjustable timing resistor 68 to the anode of the second controlled rectifier 34. The emitter of the second unijunction transistor 54 is also coupled through a second timing capacitor 70 to the reference potential bus 30.

When the two power switches 21, 59 are closed, power from the two sources of unidirectional potential 22, 60 is applied to the circuit of FIGURE 3. At this instant, neither of the controlled rectifiers 24, 34 is conducting. Current from the second source of unidirectional potential 60 flows through the emitter resistor 62 to charge the first timing capacitor 64. As the charge on the first timing capacitor 64 increases, a point will be reached at which the emitter of the first unijunction transistor 50 becomes sufficiently positive to discharge itself by a pulse of current which flows from the first timing capacitor 64 through the first unijunction transistor 50 to the gate electrode of the first controlled rectifier 24. The first timing capacitor 64 then begins to become charged again, thus providing a relaxation oscillator. This pulse of current acts as a gate current on the gate electrode of the first controlled rectifier 24, and thereby causes the first controlled rectifier 24 to conduct anode current. As previously explained, this anode current flows through the load 20. With the first controlled rectifier 24 conducting, the right-hand plate of the charging capacitor 38 becomes positive with respect to the left-hand plate of the charging capacitor 38. With the second controlled rectifier 34 in a non-conducting state, current flows through the voltage dropping resistor 32 and the adjustable timing resistor 68 to charge the second timing capacitor 70. As the charge on the second timing capacitor 70 increases, a point will be reached at which the emitter of the second unijunction transistor 54 becomes sufficiently positive to cause a pulse of current to flow from the second timing capacitor 70 through the second unijunction transistor 54 to the gate electrode of the second controlled rectifier 34. This pulse of current acts as a gate current on the gate electrode of the second controlled rectifier 34 and thereby causes the second controlled rectifier 34 to conduct anode current. As explained in connection with FIGURE 2, when the second controlled rectifier 34 conducts anode current, the charge on the charging capacitor 38 causes the first controlled rectifier 24 to cease conducting. However, while the second controlled rectifier 34 is so conducting, the charging capacitor 38 becomes charged so that its left-hand plate is positive with respect to its right-hand plate. Also, while the second controlled rectifier 34 is conducting, the first timing capacitor 64 is charging up and, when it develops a sufficient charge, it will again cause the first controlled rectifier 24 to conduct anode current. When the first controlled rectifier 24 conducts anode current, the positive charge on the left-hand plate of the charging capacitor 34 effectively appears at the cathode of the second controlled rectifier 34 and the negative charge on the right-hand plate of the charging capacitor 38 appears at the anode of the second controlled rectifier 34 thus causing the second controlled rectifier 34 to cease conduction. Then the cycle repeats itself as just described. Thus, it will be seen that the first and second controlled rectifiers 24, 34 are alternately turned on and off with current flowing through the load 20 during the time that the first controlled rectifier 24 conducts. The time during which current flows through the load 20 may be regulated or controlled by the time that the first controlled rectifier 24 conducts during each cycle. Thus, the average current or power through the load 20 may be controlled or regulated very efficiently and easily. Thus, the arrangement of FIGURE 3 permits the amount of power supplied to a load from a direct current source to be varied by pulse width modulation with substantially no loss between the pulses of power. It will be appreciated that the relative times of conduction of the first and second controlled rectifiers 24, 34 may be varied by adjusting the two timing capacitors 64, 70 and the adjustable timing resistor 68. These components, among others, serve to control the length of time required for the respective emitters of the first and second unijunction transistors 50, 54 to become sufficiently positive and cause their respective controlled rectifiers 24, 34 to conduct.

While the invention has been described with reference to particular embodiments, it is to be understood that modifications may be made by persons skilled in the art without departing from the spirit of the invention or from the scope of the claims.

What I claim as new and desire to secure by Letters Patent of the United States is:

1. A control circuit comprising a potential source, a load to be supplied from said source, a first semiconductor device having a plurality of semiconducting material zones of P and N types forming an odd number of P-N junctions, means connecting the end zones of said first device in series with said source and said load whereby at values of potential from said source less than a predetermined value an intermediate junction of said first device is biased in a reverse direction, means for supplying a current to an intermediate zone of said first device, a surface of which forms a part of said intermediate junction, of a value sufficient to cause said intermediate junction to become forwardly biased whereby said first device will conduct to cause current to flow in said load, a second semiconductor device constructed similarly to said first semiconductor device, connections between one end zone of said second device and said source, a capacitor having one end coupled to one end zone of said first device and having the other end coupled to one end zone of said second device, said one end of said capacitor being negative with respect to said other end of said capacitor when said first device conducts, connections between the other end zones of said semiconductor devices, and a relaxation oscillator comprising a unijunction transistor and adjustment means for controlling the conduction of said transistor coupled to an intermediate zone of said second device to cause an intermediate junction of said second device to become forwardly biased when said transistor conducts to cause said second device to conduct and discharge said capacitor to stop conduction of said first device.

2. A control circuit for a load to be supplied from a potential source comprising a first semiconductor device having a plurality of zones of P and N type semiconducting material forming an odd number of P-N junctions, means for connecting the end zones of said first device in series with said source and said load, the parameters of said first device being such that when it is so connected an intermediate junction thereof is biased in a reverse direction for source voltages below a determined value, a capacitor having a pair of terminals, one of said terminals being connected to one end zone of said first device, means for impressing a voltage on said capacitor such that said one terminal is negative with respect to the other terminal of said capacitor when said first device conducts, a second semiconductor device similar in construction to said first device and having an end zone of one polarity type connected to said other terminal of said capacitor and an end zone of the opposite polarity type connected to the other end zone of said first device, and an adjustable frequency oscillator for supplying a current to an intermediate zone of said second device of a value to forwardly bias an intermediate junction of said second device.

3. A control circuit for a load to be supplied from a potential source comprising a first semiconductor device having a plurality of zones of P and N type semiconducting material forming an odd number of P-N junctions, means for connecting the end zones of said first device in series with said source and said load, the parameters of said first device being such that when it is so connected an intermediate junction thereof is biased in a reverse direction for source voltages below a determined value, a capacitor having a pair of terminals, one of said terminals being connected to one end zone of said first device, means for impressing a voltage on said capacitor such that said one terminal is negative with respect to the other terminal of said capacitor when said first device conducts, a second semiconductor device similar in construction to said first device and having an end zone of one polarity type connected to said other terminal of said capacitor and an end zone of the opposite polarity type connected to the other end zone of said first device, a relaxation oscillator comprising a unijunction transistor, and adjustment means controlling the conduction of said transistor for supplying a current to an intermediate zone of said second device of a value to forwardly bias an intermediate junction of said second device, thus controlling the conduction time and average current delivered to the load.

4. A control circuit for a load to be supplied from a first potential source comprising a first semiconductor device having a plurality of zones of P and N type semiconducting material forming an odd number of P-N junctions, means for connecting a P-type end zone of said first device to said first source through said load, means for connecting an N-type end zone of said first device to said first source, the parameters of said first device being such that when said P-type end zone is positive with respect to said N-type end zone an intermediate junction formed by intermediate P and N-type zones is biased in a reverse direction by source voltages below a predetermined value, means for supplying current to one of said intermediate zones of value sufficient to bias said intermediate junction in a forward direction to cause said first device to conduct and pass current through said load, a capacitor having first and second terminals, said first terminal of said capacitor being connected to said P-type end zone of said first device, means connecting said second terminal of said capacitor to said first source so that said first terminal of said capacitor is negative with respect to said second terminal of said capacitor in response to conduction of said first device, a second semiconductor device constructed similarly to said first device, means connecting a P-type end zone of said second device to said second terminal of said capacitor, means connecting an N-type end zone of said second device to said N-type end zone of said first device, a second source of unidirectional potential, a unijunction transistor having a first terminal connected to said second source, a second terminal connected to an intermediate zone of said second device, and a third terminal, and adjustable means connected to said third terminal of said transistor to control the conduction of said transistor which, when conducting, supplies current to said intermediate zone of said second device of a value sufficient to bias an intermediate junction of said second device formed in part by said intermediate zone to cause said second device to conduct and discharge said capacitor.

References Cited in the file of this patent

UNITED STATES PATENTS

| | | |
|---|---|---|
| 2,458,283 | McCreary | Jan. 4, 1949 |
| 2,855,524 | Shockley | Oct. 7, 1958 |
| 2,874,333 | Gray | Feb. 17, 1959 |
| 2,877,359 | Ross | Mar. 10, 1959 |
| 2,952,818 | Russell | Sept. 13, 1960 |

OTHER REFERENCES

"Core Driver" from I.B.M. Technical Bulletin, vol. 2, No. 1, June 1959, page 26.

Solid State Thyratron Switches Kilowatts, "Electronics," for March 1958.

"Applications and Circuit Design Notes," S.S.P.I. Bulletin D420–02, of August 1959.